United States Patent
Busono et al.

(10) Patent No.: US 10,574,181 B2
(45) Date of Patent: Feb. 25, 2020

(54) CIRCUIT WITH SHUNT PATH

(71) Applicant: Microsoft Technology Licensing, LLC, Redmond, WA (US)

(72) Inventors: Julia Jacinta Busono, Woodinville, WA (US); Jack Thomas Lavier, Sammamish, WA (US); Robert Glenn Rundell, Bellevue, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 15/983,041

(22) Filed: May 17, 2018

(65) Prior Publication Data
US 2019/0356268 A1   Nov. 21, 2019

(51) Int. Cl.
 H03B 5/04 (2006.01)
 H03B 5/36 (2006.01)
 H03H 7/06 (2006.01)

(52) U.S. Cl.
CPC ............ H03B 5/04 (2013.01); H03B 5/364 (2013.01); H03H 7/06 (2013.01); H03B 2200/0012 (2013.01); H03B 2200/0092 (2013.01)

(58) Field of Classification Search
CPC ... H03B 5/04; H03B 5/30; H03B 5/32; H03B 5/326; H03B 5/36; H03B 5/362; H03B 5/364; H03B 5/366; H03B 5/368; H03B 2200/0012; H03B 2200/0092; H03H 7/06
USPC .......................................... 331/62, 154, 158
See application file for complete search history.

(56) References Cited

U.S. PATENT DOCUMENTS

| | | | |
|---|---|---|---|
| 3,979,698 A * | 9/1976 | Gollinger | G04F 5/06 331/116 FE |
| 4,091,338 A | 5/1978 | Morihisa | |
| 5,117,206 A * | 5/1992 | Imamura | H03L 1/026 257/312 |
| 7,075,381 B2 * | 7/2006 | Hashimoto | H03B 5/32 331/116 R |
| 7,880,553 B2 * | 2/2011 | Kikuchi | H03B 5/04 331/116 FE |
| 9,413,341 B1 | 8/2016 | Ho et al. | |

(Continued)

FOREIGN PATENT DOCUMENTS

| | | |
|---|---|---|
| EP | 2251973 A1 | 11/2010 |
| EP | 2439842 A1 | 4/2012 |

(Continued)

OTHER PUBLICATIONS

"International Search Report and Written Opinion Issued in PCT Application No. PCT/US19/41767", dated Sep. 24, 2019, 28 Pages.

*Primary Examiner* — Levi Gannon
(74) *Attorney, Agent, or Firm* — Alleman Hall Creasman & Tuttle LLP

(57) ABSTRACT

Examples are disclosed that relate to oscillator circuits. One example provides a circuit comprising an amplifier, a resonator in parallel with the amplifier, and a shunt path including one or more circuit elements, the shunt path coupled to a first node downstream of an output of the amplifier and to a second node, the shunt path configured to shunt current received at the first node away from an input of the resonator and toward the second node, the second node having, at steady state, a relatively lower voltage than an input voltage of the resonator.

18 Claims, 2 Drawing Sheets

(56) References Cited

U.S. PATENT DOCUMENTS

| | | | | |
|---|---|---|---|---|
| 2005/0083140 A1* | 4/2005 | Hashimoto | ............... | H03B 5/36 |
| | | | | 331/158 |
| 2005/0270112 A1* | 12/2005 | Viljanen | ................. | H03B 5/36 |
| | | | | 331/158 |
| 2006/0017518 A1* | 1/2006 | Wilcox | .................... | H03B 5/06 |
| | | | | 331/185 |
| 2006/0071718 A1* | 4/2006 | McCorquodale | ........ | H03B 5/04 |
| | | | | 331/16 |
| 2010/0079213 A1 | 4/2010 | Igarashi | | |
| 2011/0037526 A1* | 2/2011 | Sato | ......................... | H03B 5/36 |
| | | | | 331/116 R |
| 2011/0074499 A1* | 3/2011 | Sako | ........................ | H03B 5/36 |
| | | | | 327/596 |
| 2014/0320223 A1* | 10/2014 | Ozawa | .................. | H03B 5/364 |
| | | | | 331/116 FE |

FOREIGN PATENT DOCUMENTS

| | | | | |
|---|---|---|---|---|
| JP | S5824207 A | | 2/1983 | |
| JP | 01317004 A | * | 12/1989 | ............... H03B 5/32 |

\* cited by examiner

CIRCUIT WITH SHUNT PATH

BACKGROUND

A typical electronic oscillator converts direct voltage into alternating voltage to generate a periodic output. Periodic outputs produced by an oscillator are frequently used as a clock signal to regulate the operation of a processor, as a broadcast signal, and/or for other purposes. Various oscillator circuits have been developed, some of which may employ a piezoelectric crystal to generate periodic output.

DETAILED DESCRIPTION

As described above, a typical electronic oscillator converts direct voltage into alternating voltage to generate a periodic output. Periodic outputs produced by an oscillator are frequently used as a clock signal to regulate the operation of a processor, microcontroller, or other logic device; as a broadcast signal; and/or for other purposes. Various oscillator circuits have been developed, some of which may employ a piezoelectric crystal to generate periodic output.

Typically, the physical configuration of an oscillator crystal stipulates an upper limit on the power with which the crystal can be driven before exhibiting degraded operation. This upper limit may be referred to as the "drive load tolerance," and the power with which the crystal is driven at any point in time may be referred to as the "drive level." Drive levels that exceed the drive load tolerance may result in the crystal experiencing a condition referred to as being "overdriven," which can result in physical degradation (e.g., fracture) of the crystal, distorted oscillator output, and/or other adverse effects. As oscillator crystals are increasingly downsized—due to the selection of surface-mount crystals instead of typically larger through-hole counterparts, and other manufacturing advances—their drive load tolerances may correspondingly decrease. However, circuits designed to drive oscillator crystals have not been adapted to this decreasing drive load tolerance resulting from downsizing. Typically, vendors offer crystal drive circuits as discrete components separate from crystals, leaving third-party designers of oscillator circuits with the responsibility of interfacing drive circuits with crystals. As a result, crystal drive circuits may not be tuned for the drive load tolerances of the crystals with which they are subsequently associated. Further, the frequent implementation of amplification structures that control drive load in a crystal drive circuit make it so third-party purchasers of the drive circuit are unable to control their drive load.

Figure 1:
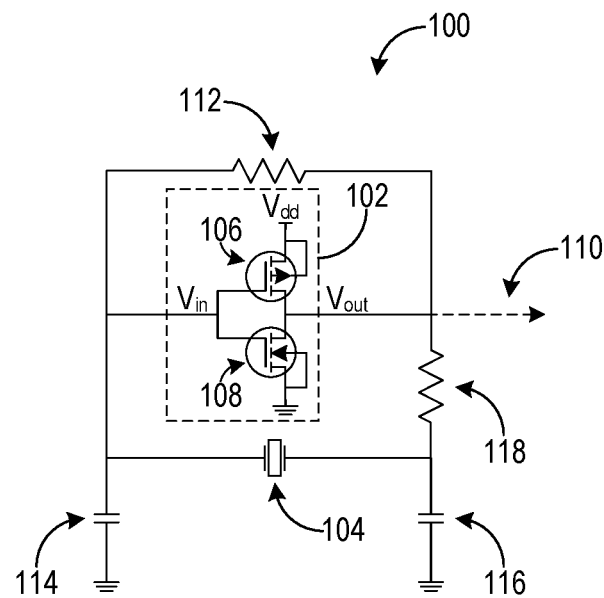
FIG. 1 schematically shows an example oscillator circuit.

One approach for at least partially addressing crystal overdriving includes the addition of a series resistance in an oscillator circuit. FIG. 1 illustrates one example of such an approach, and schematically shows an example oscillator circuit 100. Circuit 100 includes an amplifier 102 in parallel with a resonator 104, which is shown in form of a piezoelectric crystal. Resonator 104 may include a quartz crystal, a lead zirconate titanate crystal ceramic resonator, or any other resonator suitable for an oscillator circuit. In the depicted example, amplifier 102 takes the form of a complementary metal-oxide-semiconductor (CMOS) inverting amplifier with a P-type MOS (PMOS) transistor 106 and an N-type MOS (NMOS) transistor 108. A voltage source (not shown in FIG. 1) providing a voltage $V_{dd}$ is coupled to the source of PMOS transistor 106, and the source of NMOS transistor is coupled to ground. Further, the drain of transistor 106 is coupled to the drain of transistor 108, and the gate of transistor 106 is coupled to the gate of transistor 108. Amplifier 102 may assume any suitable form that provides the desired gain and phase shift (e.g., −180 degrees) for sustaining oscillation, however. The output of amplifier 102 (and of oscillator circuit 100 overall) is indicated at 110, and includes an oscillating signal that may be used as a clock signal, a broadcast signal, and/or for any other suitable purpose. In some examples, the output may oscillate at substantially a single frequency.

Circuit 100 also includes a resistor 112 in parallel with amplifier 102. Resistor 112 may bias amplifier 102 at its midpoint—e.g., within the amplifier's linear region of operation—and cause the input voltage ($V_{in}$) of the amplifier to be substantially equal to the output voltage ($V_{out}$) of the amplifier. More particularly, resistor 112 may help center amplifier 102 at the midpoint during startup of circuit 100, as, during this period of operation, output from the circuit may be unstable (e.g., undesirably varying in frequency). Resistor 112 may have any suitable resistance, such as 1 MΩ As an example, resistor 112 may implement a direct current (DC) bias of approximately $V_{DD}/2$ to amplifier 102.

Circuit 100 further includes a capacitor 114 coupled to the gates of transistors 106 and 108, and a capacitor 116 arranged downstream of the drains of the transistors. Capacitors 114 and 116 are each further coupled to ground. The capacitance values of capacitors 114 and 116 may be selected to achieve a desired frequency of the output of circuit 100. Further, capacitors 114 and 116, along with other components of circuit 100, may provide phase shifts to current flowing through the circuit that help facilitate desired signal amplification at amplifier 102 and desired signal output from the circuit.

Were the power supplied to resonator 104 to exceed the drive load tolerance of the resonator, physical degradation of the resonator and/or undesired output from circuit 100 may result. Overdriving of resonator 104 may result from a failure to tune the drive load produced by amplifier 102 (and influenced by other components of circuit 100) to the drive load tolerance of the resonator, which, as described above, may result from portions of the circuit being supplied separately from the resonator. In some examples, an entity other than a vendor of these circuit portions, such as a designer of circuit 100 who interfaces the circuit portions with resonator 104, may find it impracticable to alter the drive load by modifying the amplification structures within amplifier 102 due to their internal implementation in the amplifier. To address these issues and avoid overdriven operation of resonator 104, circuit 100 includes a resistor 118 in series with the output of amplifier 102 and the inputs of resonator 104 and capacitor 116.

However, the addition of resistor 118 in circuit 100 may present various issues that inhibit desired operation of the circuit. For example, resistor 118 adds a voltage drop between its input and output, adding a corresponding voltage drop to the input of resonator 104 and amplifier 102. This voltage drop may cause the input voltage at amplifier 102 to fail to meet the common-mode voltage requirement of the amplifier, which consequently may fall out of its linear range of operation, resulting in degraded operation of circuit 100. The inclusion of resistor 118 may thus be an ineffective solution—e.g., a voltage drop—to a transconductance issue.

Figure 2:
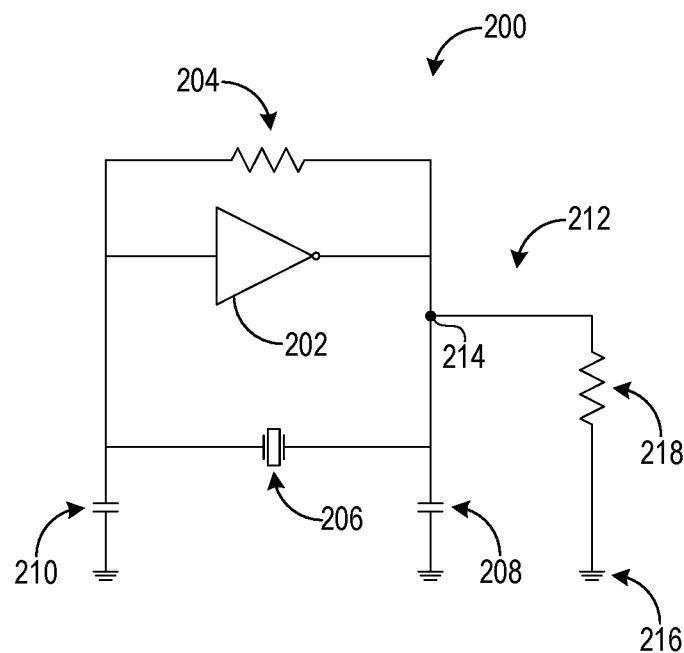
FIG. 2 schematically shows another example oscillator circuit having a first shunt path.
Figure 3:
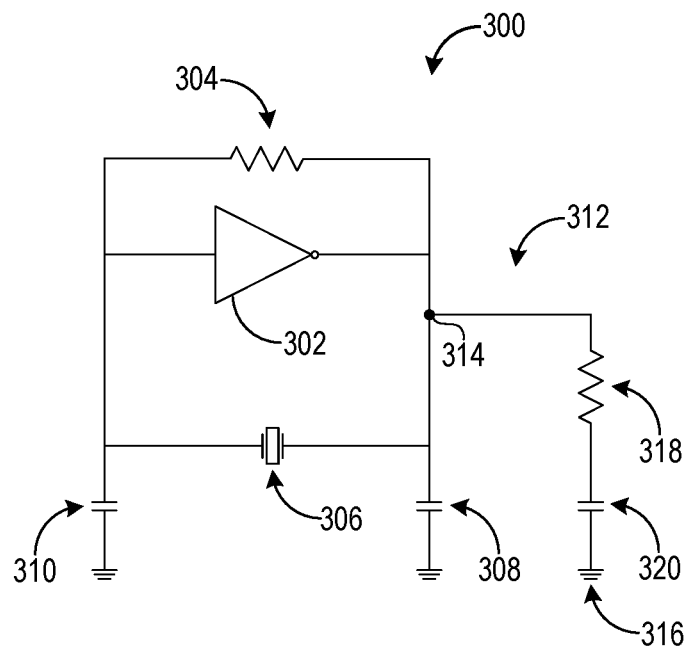
FIG. 3 schematically shows another example oscillator circuit having a second shunt path.
Figure 4:
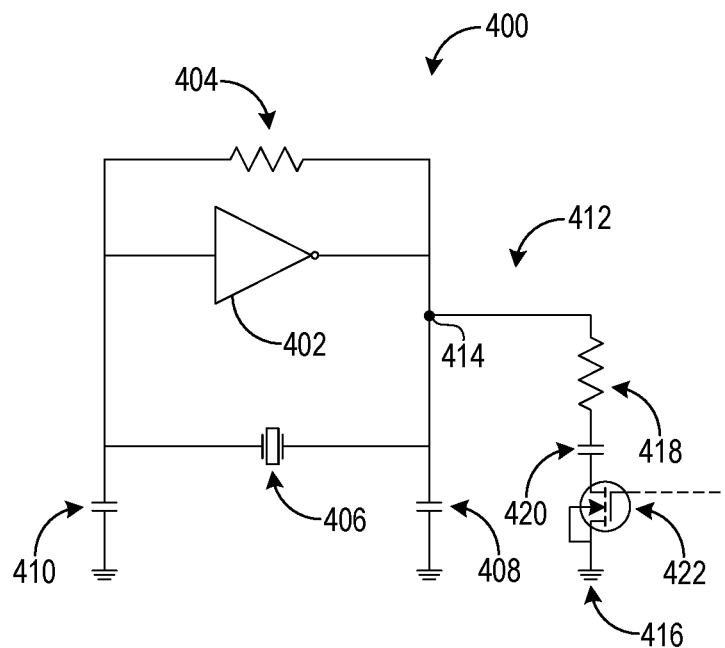
FIG. 4 schematically shows another example oscillator circuit having a third shunt path.

FIGS. 2-4 respectively illustrate alternative approaches to designing an oscillator circuit that avoid overdriving a resonator without introducing the issues associated with circuit 100 described above. In these examples, the drive level applied to a resonator is constrained not by introducing a voltage drop via a resistive series circuit element, but by constraining current supply to the resonator by shunting current away from the resonator via an alternative current path.

FIG. 2 schematically shows an example oscillator circuit 200 that includes an amplifier 202 in parallel with a resistor 204 and a resonator 206. Some aspects of circuit 200 may be shared with those of circuit 100, and as such may be understood from the foregoing description. Amplifier 202 may be an inverting CMOS input buffer (e.g., amplifier 102) or any other suitable amplifier. Resistor 204 (e.g., resistor 112) may apply a DC bias to amplifier 202 such that the amplifier is biased at its midpoint, for example. Resonator 206 (e.g., resonator 104) may be a piezoelectric crystal, ceramic crystal, or any other suitable resonator for producing oscillating output. The internal structure of amplifier 102, and the input and output of circuit 200, are not shown in FIG. 2 for simplicity. Circuit 200 also includes a capacitor 208 (e.g., capacitor 116) coupled to the output of amplifier 202 and to ground, and a capacitor 210 (e.g., capacitor 114) coupled to the output of resonator 206 and to ground.

Circuit 200 further includes a shunt path 212 coupled to a first node 214 downstream of the output of amplifier 202, and to a second node 216. At steady state of circuit 200, second node 216 may have a relatively lower voltage than an input voltage of resonator 206, such that at least a portion of current flowing from the output of amplifier 202 flows into first node 214 and into the second node. As shown in FIG. 2, in some examples second node 216 may be a ground node. Shunt path 212 includes a resistor 218 that dissipates current shunted away from resonator 206 and into the shunt path. The resistance of resistor 218 may be selected based on a desired dissipation current. When this dissipation current is dissipated by resistor 218, the remaining current that is not shunted into shunt path 212 and dissipated by the resistor, but that instead flows into resonator 206, a drive level of the resonator may result that satisfies a non-overdrive condition of the resonator—i.e., a drive level that does not exceed the drive load tolerance of the resonator and thereby overdrive the resonator. The resistance of resistor 218 may be further selected based on the common-mode voltage requirement of amplifier 202 (e.g., using its midpoint voltage), so that the remaining current not shunted into shunt path 212 is sufficient to support desired operation of the amplifier. Further, the resistance of resistor 204 may be selected in view of the inclusion of resistor 218 to achieve an appropriate DC bias for amplifier 202.

Circuit 200 represents an approach in which the supply of current to resonator 206 is constrained via an alternative current path, as opposed to approaches in which the overall power delivered to a resonator is constrained by a series resistance, as in circuit 100. In other words, approaches represented by circuit 100 merely consider the issue of an overdriven resonator in terms of the bulk power delivered to the resonator, whereas approaches represented by circuit 200 (and the circuits shown in FIGS. 3 and 4 described below) address resonator overdriving by identifying excess current to be shunted elsewhere. Motivated in this way, shunt path 212 may mitigate degradation of resonator 206 and resulting degraded oscillator output without inhibiting operation of amplifier 202.

While circuit 200 largely addresses the issues associated with circuit 100 described above, some opportunities for improvement in relation to addressing overdrive may remain. For example, reducing the current available to resonator 206 at startup of circuit 200 may adversely affect the resonator's ability to initiate oscillation, which could inhibit overall operation of the circuit. Further, the additional DC path to second node 216 (e.g., ground) may affect the DC metastable point of circuit 200—e.g., in such a manner that renders the circuit unstable. To address these issues, the DC path to ground provided by shunt path 212 may be substantially blocked.

FIG. 3 schematically shows an example oscillator circuit 300. Circuit 300 includes an amplifier 302 in parallel with a resistor 304 and a resonator 306. Some aspects of circuit 300 may be shared with those of circuits 100 and/or 200, and as such may be understood with reference to the foregoing description. Amplifier 302 may be an inverting CMOS input buffer (e.g., amplifier 102) or any other suitable amplifier. Resistor 304 (e.g., resistor 112) may apply a DC bias to amplifier 302 such that the amplifier is biased at its midpoint, for example. Resonator 306 (e.g., resonator 104) may be a piezoelectric crystal, ceramic crystal, or any other suitable resonator for producing oscillating output. The internal structure of amplifier 302, and the input and output of circuit 300, are not shown in FIG. 3 for simplicity. Circuit 300 also includes a capacitor 308 (e.g., capacitor 116) coupled to the output of amplifier 302 and to ground, and a capacitor 310 (e.g., capacitor 114) coupled to the output of resonator 306 and to ground.

Circuit 300 further includes a shunt path 312 coupled to a first node 314 downstream of the output of amplifier 302, and to a second node 316 (e.g., a ground node). At steady state of circuit 300, second node 316 may have a relatively lower voltage than an input voltage of resonator 306, such that at least a portion of current flowing from the output of amplifier 302 flows into first node 314 and into the second node. Shunt path 312 includes a resistor 318 that dissipates current shunted away from resonator 306 and into the shunt path. The resistance of resistor 318 may be selected based on a desired dissipation current (and on a common-mode voltage requirement of amplifier 302), such that, when dissipated by the resistor, a non-overdrive condition of resonator 306 is satisfied, while the remaining current flowing into amplifier 302 is sufficient to support desired operation of the amplifier.

Shunt path 312 further includes a capacitor 320 in series with and downstream of resistor 318, and coupled to second node 316. Via its response to DC, capacitor 320 may substantially eliminate the DC path to second node 316 otherwise provided by shunt path 312. Conversely, the capacitance of capacitor 320 may be selected to minimize the impedance of the capacitor at an oscillation frequency of circuit 300, so that desired current shunting facilitated by shunt path 312 is preserved. As is evident from FIG. 3, the series arrangement of resistor 318 and capacitor 320 form a resistor-capacitor (RC) network, which may function as a high-pass filter. As in some examples a substantially single frequency of output may be desired from circuit 300, this RC network may desirably reduce other harmonics and facilitate desired circuit output. Other filter structures, alternatively or in addition to the RC network, may be implemented in circuit 300, however, including active, passive, high-pass, and band-pass filter structures.

Circuit 300 may at least partially address the issues associated with circuit 200 described above—for example, circuit instability resulting from a DC path to second node 316 otherwise created without the inclusion of capacitor 320). However, to secure sufficient current supply to amplifier 302 at startup, it may be desirable to employ a switching mechanism for selectively disabling current shunting.

FIG. 4 schematically shows an example oscillator circuit 400. Circuit 400 includes an amplifier 402 in parallel with a resistor 404 and a resonator 406. Some aspects of circuit 400 may be shared with those of circuits 100, 200, and/or 300, and as such may be understood from the foregoing description. Amplifier 402 may be an inverting CMOS input buffer (e.g., amplifier 102) or any other suitable amplifier. Resistor 404 (e.g., resistor 112) may apply a DC bias to amplifier 402 such that the amplifier is biased at its midpoint, for example. Resonator 406 (e.g., resonator 104) may be a piezoelectric crystal, ceramic crystal, or any other suitable resonator for producing oscillating output. The internal structure of amplifier 402, and the input and output of circuit 400, are not shown in FIG. 4 for simplicity. Circuit 400 also includes a capacitor 408 (e.g., capacitor 116) coupled to the output of amplifier 402 and to ground, and a capacitor 410 (e.g., capacitor 114) coupled to the output of resonator 406 and to ground.

Circuit 400 further includes a shunt path 412 coupled to a first node 414 downstream of the output of amplifier 402, and to a second node 416 (e.g., a ground node). At steady state of circuit 400, second node 416 may have a relatively lower voltage than an input voltage of resonator 406, such that at least a portion of current flowing from the output of amplifier 402 flows into first node 414 and into the second node. Shunt path 412 includes a resistor 418 that dissipates current shunted away from resonator 406 and into the shunt path. The resistance of resistor 418 may be selected based on a desired dissipation current (and on a common-mode voltage requirement of amplifier 402), such that, when dissipated by the resistor, a non-overdrive condition of resonator 406 is satisfied, while the remaining current flowing into amplifier 402 is sufficient to support desired operation of the amplifier.

Shunt path 412 further includes a capacitor 420 in series with and downstream of resistor 418, and coupled to second node 416. Via its response to DC, capacitor 420 may substantially eliminate the DC path to second node 416 otherwise provided by shunt path 412. Conversely, the capacitance of capacitor 420 may be selected to minimize the impedance of the capacitor at an oscillation frequency of circuit 400, so that desired current shunting facilitated by shunt path 412 is preserved. As is evident from FIG. 3, the series arrangement of resistor 418 and capacitor 420 form a resistor-capacitor (RC) network, which may function as a high-pass filter. As in some examples a substantially single frequency of output may be desired from circuit 400, this RC network may desirably reduce other harmonics and facilitate desired circuit output. Other filter structures, alternatively or in addition to the RC network, may be implemented in circuit 400, however, including active, passive, high-pass, and band-pass filter structures.

Shunt path 412 also includes a switch 422 in series with resistor 418 and capacitor 420. Switch 422 is operable to electrically disconnect second node 416 from resistor 418 and capacitor 420, and thereby disable shunting of the current received at first node 414 away from the input of resonator 406 toward the second node. In a more general sense, switch 422 is operable to electrically disconnect shunt path 412 from first node 414 and the rest of circuit 400, to selectively control when current is and is not shunted away from resonator 406. In some examples, switch 422 may be controlled to disable current shunting via shunt path 412 until steady state of circuit 400 is reached—e.g., during startup of the circuit. In this way, amplifier 402 may receive sufficient current during startup of circuit 400, facilitating desired operation of amplifier and output of the circuit. Switch 422 may thus enable the operating conditions of circuit 400 to be changed after startup (and during other stages of operation).

In some examples, switch 422 may include a transistor, such as a metal-oxide-semiconductor field-effect transistor (MOSFET). In the example depicted in FIG. 4, switch 422 takes the form of an NMOS transistor, with its drain coupled to the output of capacitor 420 and its source coupled to second node 416. Any suitable implementation of switch 422 is possible, however, including its implementation as a PMOS transistor. A PMOS transistor may facilitate the formation of a desired current drop across the transistor, while an NMOS transistor may be more robust with respect to mitigating nonlinearities in its output and resulting spurious frequencies in the output of circuit 400. Other arrangements of switch 422 are possible, such as those in which the switch is implemented as a PMOS transistor located between the output of amplifier 402 and resistor 418.

Control signals for operating switch 422 may be generated in any suitable manner. In one example, control signals may be generated via a (e.g., digital) counter or a phase-loop-lock (PLL) indicator. In another example, control signals may be generated via circuit 400—for example, amplifier 402 and resonator 406 (and potentially other elements of the circuit) may form an oscillator, and switch 422 may be controlled by signals produced by the oscillator (e.g., the periodic output of the oscillator, and/or signal(s) derived from the oscillator output).

In view of the above, shunt path 412 and the circuit elements therein may achieve the following effects: (1) desired startup of circuit 400 and achievement of circuit steady state and oscillating output, (2) non-overdriven operation of resonator 406 and the mitigation of resonator degradation and degraded oscillator output, and (3) stable operation of the circuit and desired output filtering via the RC network formed by resistor 418 and capacitor 420. Via the selective connection and disconnection of shunt path 412 enabled by switch 422, different configurations of circuit 400 for startup and steady state may be respectively achieved without diminishing circuit operation in either state.

Circuits 100, 200, 300, and 400 are provided as examples, and any suitable modification to the approaches described herein are within the scope of this disclosure. Further, in some examples various terms used herein to describe electrical circuit elements may not connote a specific circuit element, or physical or electrical structure. For example, "resistor" as used herein may not refer to a resistor per se, but a circuit element that has resistance, and "capacitor" as used herein may not refer to a capacitor per se, but a circuit element that has capacitance.

Another example provides a circuit comprising an amplifier, a resonator in parallel with the amplifier, and a shunt path including one or more circuit elements, the shunt path coupled to a first node downstream of an output of the amplifier and to a second node, the shunt path configured to shunt current received at the first node away from an input of the resonator and toward the second node, the second node having, at steady state, a relatively lower voltage than an input voltage of the resonator. In such an example, the circuit alternatively or additionally may comprise a resistor in parallel with the amplifier. In such an example, the one or more circuit elements may include a resistor. In such an example, a resistance of the resistor may be selected based on a dissipation current associated with the resonator, such that, with the dissipation current dissipated by the resistor, a non-overdrive condition of the resonator is satisfied. In such an example, the resistance alternatively or additionally may be selected based on a common-mode voltage requirement of the amplifier. In such an example, the one or more circuit elements alternatively or additionally may include a capacitor. In such an example, a capacitance of the capacitor may be selected to minimize an impedance of the capacitor at an oscillation frequency of the circuit. In such an example, the capacitor may substantially eliminate a DC path to the second node. In such an example, the resistor and the capacitor may form a high-pass filter. In such an example, the one or more circuit elements alternatively or additionally may include a switch operable to electrically disconnect the second node from the one or more circuit elements and thereby disable shunting of the current received at the first node away from the input of the resonator and toward the second node until steady state is reached. In such an example, the switch may include a MOSFET. In such an example, the amplifier and the resonator may form an oscillator, and the switch may be controlled by a signal produced by the oscillator. In such an example, the second node may be a ground node.

Another example provides a circuit comprising an amplifier, a resonator in parallel with the amplifier, and a shunt path including a resistor, the shunt path coupled to a first node downstream of an output of the amplifier and to a second node, the shunt path configured to shunt current received at the first node away from an input of the resonator and toward the second node, the second node having, at steady state, a relatively lower voltage than an input voltage of the resonator. In such an example, a resistance of the resistor may be selected based on a dissipation current associated with the resonator, such that, with the dissipation current dissipated by the resistor, a non-overdrive condition of the resonator may be satisfied. In such an example, the shunt path alternatively or additionally may include a capacitor. In such an example, the shunt path alternatively or additionally may include a switch operable to electrically disconnect the second node from the resistor and the capacitor and thereby disable shunting of the current received at the first node away from the input of the resonator and toward the second node until steady state is reached. In such an example, the amplifier and the resonator may form an oscillator, and the switch may be controlled by a signal produced by the oscillator.

Another example provides a circuit comprising an amplifier, a resonator in parallel with the amplifier, and a shunt path including one or more circuit elements, the shunt path coupled to a first node downstream of an output of the amplifier and to a second node, the shunt path configured to limit current supply to the resonator by shunting current away from an input of the resonator and toward the second node, such that the current shunted away from the input of the resonator results in a drive level of the resonator that satisfies a non-overdrive condition of the resonator. In such an example, the one or more circuit elements may include a resistor, a capacitor, and a switch operable to electrically disconnect the second node from the one or more circuit elements and thereby disable shunting of the current away from the input of the resonator and toward the second node until steady state is reached.

It will be understood that the configurations and/or approaches described herein are exemplary in nature, and that these specific embodiments or examples are not to be considered in a limiting sense, because numerous variations are possible. The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A circuit, comprising:
an amplifier;
a resonator in parallel with the amplifier; and
a shunt path including one or more circuit elements, the shunt path coupled to a first node downstream of an output of the amplifier and to a second node, the shunt path configured to shunt current received at the first node away from an input of the resonator and toward the second node, the second node having, at steady state, a relatively lower voltage than an input voltage of the resonator, the one or more circuit elements including a switch operable to electrically disconnect the second node from the one or more circuit elements and thereby disable shunting of the current received at the first node until steady state is reached.

2. The circuit of claim 1, further comprising a resistor in parallel with the amplifier.

3. The circuit of claim 1, where the one or more circuit elements include a resistor.

4. The circuit of claim 3, where a resistance of the resistor is selected based on a dissipation current associated with the resonator, such that, with the dissipation current dissipated by the resistor, a non-overdrive condition of the resonator is satisfied.

5. The circuit of claim 3, where the resistance is further selected based on a common-mode voltage requirement of the amplifier.

6. The circuit of claim 3, where the one or more circuit elements include a capacitor.

7. The circuit of claim 6, where a capacitance of the capacitor is selected to minimize an impedance of the capacitor at an oscillation frequency of the circuit.

8. The circuit of claim 6, where the capacitor substantially eliminates a DC path to the second node.

9. The circuit of claim 6, where the resistor and the capacitor form a high-pass filter.

10. The circuit of claim 1, where the switch includes a MOSFET.

11. The circuit of claim 1, where the amplifier and the resonator form an oscillator, and where the switch is controlled by a signal produced by the oscillator.

12. The circuit of claim 1, where the second node is a ground node.

13. A circuit, comprising:
an amplifier;
a resonator in parallel with the amplifier; and
a shunt path including a resistor and a switch, the shunt path coupled to a first node downstream of an output of the amplifier and to a second node, the shunt path configured to shunt current received at the first node away from an input of the resonator and toward the second node, the second node having, at steady state, a relatively lower voltage than an input voltage of the resonator, the switch being operable to electrically disconnect the second node from the resistor and thereby disable shunting of the current received at the first node away from the input of the resonator and toward the second node until steady state is reached.

14. The circuit of claim 13, where a resistance of the resistor is selected based on a dissipation current associated with the resonator, such that, with the dissipation current dissipated by the resistor, a non-overdrive condition of the resonator is satisfied.

15. The circuit of claim 13, where the shunt path includes a capacitor.

16. The circuit of claim 13, where the amplifier and the resonator form an oscillator, and where the switch is controlled by a signal produced by the oscillator.

17. A circuit, comprising:
an amplifier;
a resonator in parallel with the amplifier; and
a shunt path including one or more circuit elements, the shunt path coupled to a first node downstream of an output of the amplifier and to a second node, the shunt path configured to limit current supply to the resonator by shunting current away from an input of the resonator and toward the second node, such that the current shunted away from the input of the resonator results in a drive level of the resonator that satisfies a non-overdrive condition of the resonator, the one or more circuit elements including a switch operable to electrically disconnect the second node from the one or more circuit elements and thereby disable shunting of the current away from the input of the resonator and toward the second node until steady state is reached.

18. The circuit of claim 17, where the one or more circuit elements include:
a resistor; and
a capacitor.

* * * * *